(12) United States Patent
Bodnar et al.

(10) Patent No.: US 11,063,602 B1
(45) Date of Patent: Jul. 13, 2021

(54) SWITCHED CAPACITOR CIRCUITS

(71) Applicant: Analog Devices International Unlimited Company, Limerick (IE)

(72) Inventors: Rares Andrei Bodnar, Berkshire (GB); Pasquale Delizia, Newbury (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/782,623

(22) Filed: Feb. 5, 2020

(51) Int. Cl.
| | |
|---|---|
| *H03M 1/66* | (2006.01) |
| *H03M 1/08* | (2006.01) |
| *H03K 5/24* | (2006.01) |
| *H03F 3/00* | (2006.01) |
| *H03M 1/06* | (2006.01) |
| *H03M 1/00* | (2006.01) |
| *H03M 1/10* | (2006.01) |
| *H03M 1/12* | (2006.01) |

(52) U.S. Cl.
CPC .............. *H03M 1/08* (2013.01); *H03F 3/005* (2013.01); *H03K 5/24* (2013.01); *H03F 2200/372* (2013.01); *H03M 1/00* (2013.01); *H03M 1/06* (2013.01); *H03M 1/10* (2013.01); *H03M 1/12* (2013.01); *H03M 1/66* (2013.01)

(58) Field of Classification Search
CPC ............ H03M 1/66; H03M 1/06; H03M 1/10; H03M 1/12; H03M 1/00
USPC .......................... 341/144, 118, 120, 155, 150
See application file for complete search history.

(56) References Cited

U.S. PATENT DOCUMENTS

| | | | |
|---|---|---|---|
| 6,803,555 B1 | 10/2004 | Parrish et al. | |
| 8,040,264 B2 | 10/2011 | Hummerston et al. | |
| 8,508,257 B2* | 8/2013 | Kapusta ............... | G11C 27/026 327/94 |
| 8,604,962 B1 | 12/2013 | Lewyn | |
| 9,231,539 B2 | 1/2016 | Lyden et al. | |
| 9,444,406 B1 | 9/2016 | Perrott et al. | |
| 10,128,859 B1 | 11/2018 | Rajasekhar et al. | |
| 10,177,779 B2 | 1/2019 | Lee et al. | |
| 2013/0069808 A1* | 3/2013 | Reddy ................. | H03M 1/1019 341/118 |

OTHER PUBLICATIONS

Kapusta, Ron, et al., "Sampling Circuits That Break the kT/C Thermal Noise Limit", IEEE Journal of Solid-State Circuits, 49(8), (Aug. 2014), 8 pgs.

(Continued)

*Primary Examiner* — Joseph J Lauture
(74) *Attorney, Agent, or Firm* — Schwegman Lundberg & Woessner, P.A.

(57) ABSTRACT

A device having a capacitive sampling structure that allows for removal of sampling noise can be implemented in a variety of applications. Noise cancellation can be achieved by storing on an auto-zero capacitor a scaled replica of kT/C noise by a mechanism of correlated sampling. In an example embodiment, a set of switches can be arranged such that, in switching, scaled thermal noise, generated in an acquisition phase in which a voltage signal is input to an input capacitor structure, is captured on an output capacitor structure and, in a conversion phase, the captured thermal noise is cancelled or compensated from an output of the output capacitor structure.

30 Claims, 7 Drawing Sheets

(56) References Cited

OTHER PUBLICATIONS

Menolfi, Christian, et al., "A Low-Noise CMOS Instrumentation Amplifier for Thermoelectric Infrared Detectors", IEEE Journal of Solid-State Circuits, 32(7), (Jul. 1997), 968-876.

Zhu, Haiyang, "Design Techniques to Improve Noise and Linearity of Data Converters", Doctorate Dissertation in Electrical Engineering at Northeastern University, Boston, MA, (Apr. 2016), 101 pgs.

Zjajo, A., et al., "Ch. 3: Design of Multi-Step Analog to Digital Converters", Low-Power High-Resolution Analog to Digital Converters, Springer, Dordrecht, (2011), 41-102.

\* cited by examiner

SWITCHED CAPACITOR CIRCUITS

FIELD OF THE DISCLOSURE

This document relates to switched capacitor circuits and in particular to removing sampling noise in switched capacitor—amplifier circuits.

BACKGROUND

One of the main problems in precision converters is the sampling noise of a capacitive digital-to-analog converter (DAC). During an acquisition phase, the sampling structure exhibits a noise with a root mean square (RMS) value equal to $$\sqrt{\frac{kT}{C}},$$

produced by resistors connected in series with a capacitor. In the noise expression, k is Boltzmann's constant, T is the absolute temperature, and C is the value of the sampling capacitor. It can be seen, from the above relation, that in order to reduce the acquisition noise, the size of the input capacitor can be increased to levels which make the kT/C noise tolerable, which is detrimental. This detrimental aspect is due mainly to the increased size of the capacitor making it more difficult to drive the capacitor by an analog front end. In addition, the increased size of the capacitor slows down the conversion speed. That is, large capacitors are difficult to drive, occupy large area, and slow down conversion speed. As CMOS technology is scaling, the reference voltage is also dropping, which forces the designer to further increase the size of the sampling capacitors. Therefore, reducing input capacitor size without impacting the sampled noise becomes highly desirable.

SUMMARY OF THE DISCLOSURE

A device having a capacitive sampling structure that allows for removal of sampling noise can be implemented in a variety of applications. Noise cancellation can be achieved by storing on an auto-zero capacitor a scaled replica of kT/C noise by a mechanism of correlated sampling. In an example embodiment, a set of switches can be arranged such that, in switching, scaled thermal noise, generated in an acquisition phase in which a voltage signal is input to an input capacitor structure, is captured on an output capacitor structure and, in a conversion phase, the captured thermal noise is cancelled or compensated from an output of the output capacitor structure.

For example, in certain embodiments, a device, having a capacitive sampling structure, can be provided that discloses: an amplifier having an amplifier input and an amplifier output; an input capacitor structure coupled to the amplifier input; an output capacitor structure coupled to the amplifier output; and a set of switches arranged with respect to the amplifier such that, in switching, scaled thermal noise, generated in an acquisition phase in which a voltage signal is input to the input capacitor structure, is captured on the output capacitor structure and, in a conversion phase, the captured thermal noise is canceled or compensated from an output of the output capacitor structure.

In certain embodiments, a method of noise reduction in a sampling structure can be provided that discloses: operating a set of switches arranged with respect to an amplifier to capture scaled thermal noise estimation on an output capacitor structure coupled to the amplifier, during an acquisition phase in which a voltage signal is input to an input capacitor structure coupled to the amplifier; and operating the set of switches, in a conversion phase following the acquisition phase, to provide an output voltage from an output of the output capacitor structure without the scaled thermal noise estimation generated in the acquisition phase.

In certain embodiments, a device, having a sampling structure, can be provided that discloses: a first means for storing charge; a second means for storing charge; a means for amplifying a signal; a means for capturing thermal noise on an input of the means for amplifying a signal during an acquisition phase in which a voltage signal is input to the first means for storing charge; and a means for canceling scaled thermal noise, generated during the acquisition phase from the means for amplifying a signal, from an output of the second means for storing charge during a conversion phase.

BRIEF DESCRIPTION OF THE DRAWINGS

The drawings, which are not necessarily drawn to scale, illustrate generally, by way of example, but not by way of limitation, various embodiments discussed in the present disclosure.

DETAILED DESCRIPTION

The following provides a discussion of example embodiments of switched capacitor circuits, in accordance with the teachings herein. Such switched capacitor circuits illustrate architectures that provide methods of removing sampling noise in charge redistribution circuits. Such charge redistribution circuits can include, but are not limited to, analog-to-digital converters. In various embodiments, a tracking and synchronous sampling mechanism of thermal noise generated by a band-limiting resistor and sampling switches can be used to achieve a reduction of the noise sampled on an input capacitor.

Figure 1:
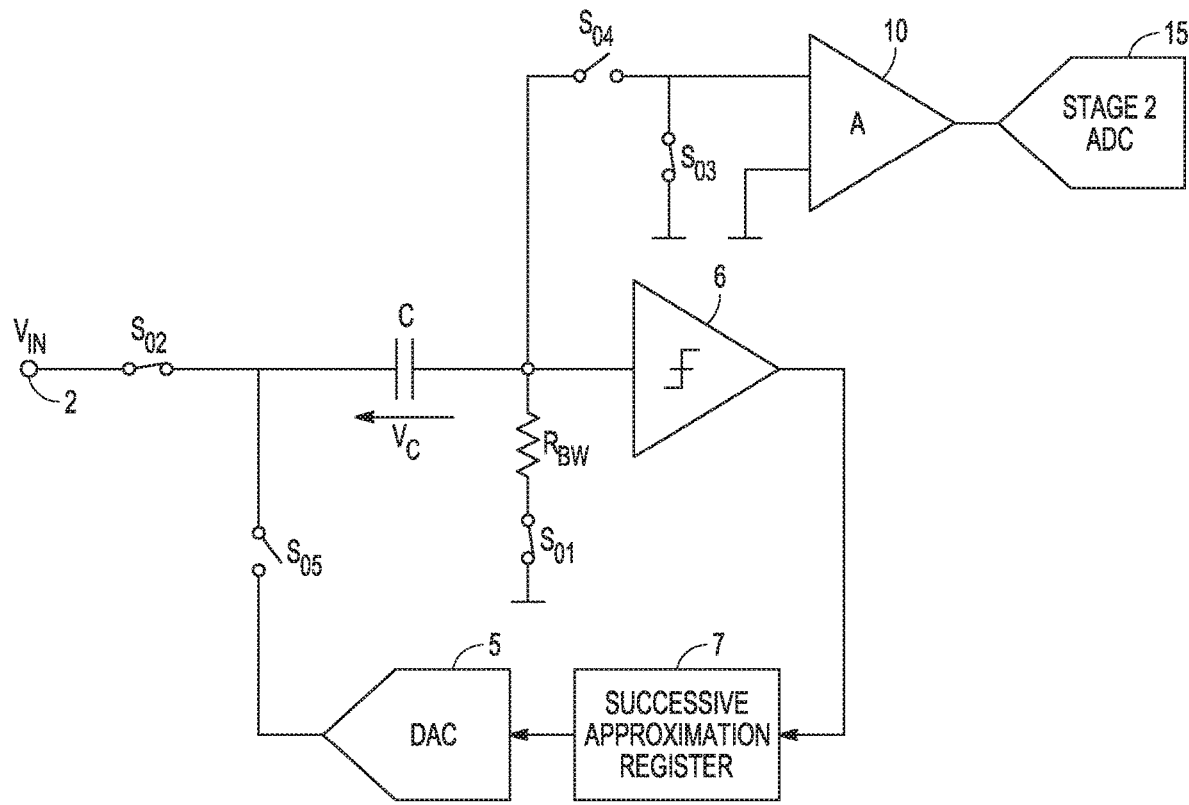
FIG. 1 illustrates an example approach to a two-stage-pipeline analog-to-digital converter, associated with various embodiments.

FIG. 1 illustrates an approach to a two-stage-pipeline analog-to-digital converter (ADC). The approach can be extended to more than two stages. A pipeline or multi-stage capacitive charge redistribution ADC operates in two phases, where one phase is an acquisition phase and the other phase is a conversion and residue amplification phase. During the acquisition phase, selected ones ($S_{01}$, $S_{02}$, and $S_{03}$) of a set of switches ($S_{01}$, $S_{02}$, $S_{03}$, $S_{04}$, and $S_{05}$,) are closed and other selected ones ($S_{04}$ and $S_{05}$) of the set are open. An input signal, $V_{IN}$ at node 2, is acquired on a capacitor C that is coupled to an amplifier 10 by switch $S_{04}$ of the set selected to be open during the acquisition phase. An amplifier is an electronic device that receives an input signal and outputs a scaled version of the input signal. The amount of scaling provided by an amplifier is measured by its gain, which is a ratio of output voltage, output current, or output power to its input. A resistor $R_{BW}$ can be introduced in a capacitive charge redistribution in order to limit the bandwidth of the acquired signal. Resistor $R_{BW}$ can be implemented as resistance of switch $S_{01}$. The amplifier 10 can have an input connected to a differentially low impedance node, usually going through an offset nulling phase.

With switches $S_{02}$ and $S_{01}$ closed with switches $S_{04}$ and $S_{05}$ open, capacitor C is coupled to node 2 to receive $V_{IN}$ and is coupled to a comparator 6. A voltage $V_C$ is developed across capacitor C. An output of comparator 6 is coupled to a successive approximation register (SAR) 7. Logic of SAR 7 is used to provide an input to a DAC 5. An output of DAC 5 can be coupled to capacitor C when switch $S_{05}$ is closed, where at this time switch $S_{02}$ is open.

During the conversion and residue amplification phase, switches ($S_{01}$, $S_{02}$, and $S_{03}$) that were closed in the acquisition phase are opened and switches ($S_{04}$ and $S_{05}$) that were open in the acquisition phase are closed. The switch $S_{04}$ that couples the capacitor C to amplifier 10, which can be realized as a residue amplifier, is closed and a previously open switch $S_{05}$ is closed to selectively connect the other side of the capacitor C, opposite the amplifier 10, to the output of DAC 5. With the capacitor C being a capacitor array, selectively connecting to the capacitor array can be based on a SAR algorithm. The residue amplifier 10 scales the difference between a quantized version of the input signal and the input signal, producing an input voltage to a second stage 15 of the ADC. After the second stage 15 of the ADC samples the amplifier voltage from the residue amplifier, the second stage converts it to a numerical version. The numerical results of the first stage and the second stage of the ADC are then combined, resulting in a final ADC result. The two-stage-pipeline ADC of FIG. 1 can be modified with a tracking and synchronous sampling mechanism of thermal noise to achieve a reduction of the noise sampled on the input capacitor C.

Figure 2:
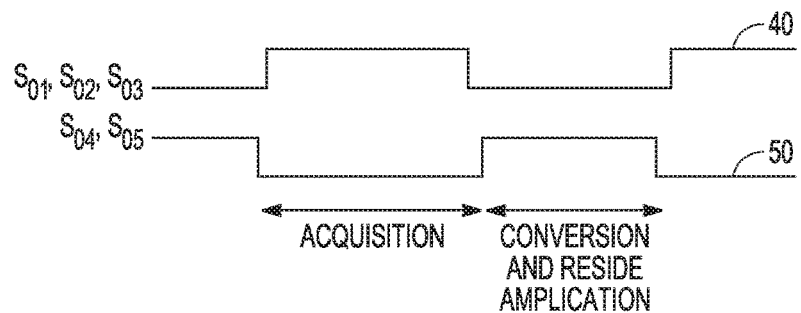
FIG. 2 illustrates example signals provided to the switches of the two-stage analog-to-digital converter of FIG. 1, associated with various embodiments.

FIG. 2 illustrates example signals provided to the switches of the two-stage ADC of FIG. 1. Signal 40 is provided to switches $S_{01}$, $S_{02}$, and $S_{03}$ during the acquisition and conversion phases. With signal 40 high, these switches are closed for acquisition, and these switches are open for conversion when signal 40 is low. Signal 50 is provided to switches $S_{04}$ and $S_{05}$ during the acquisition and conversion phases. With signal 50 low, these switches are open for acquisition, and these switches are closed for conversion when signal 50 is high.

Figure 3:
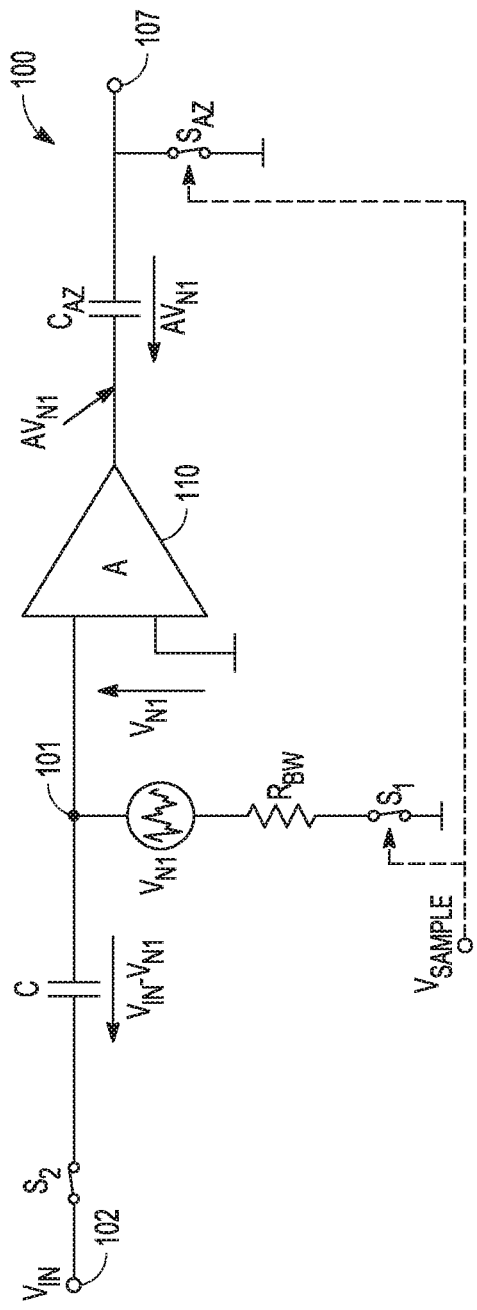
FIG. 3 is a schematic representation of a sampling phase of an example noise cancellation technique in an analog-to-digital converter stage, according to various embodiments.
Figure 4:
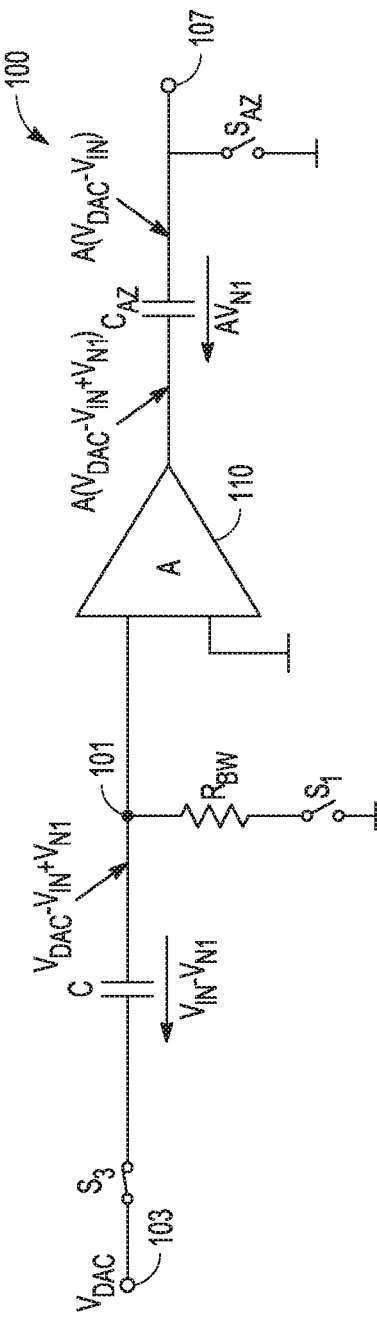
FIG. 4 is a schematic representation of a residue generation phase of the example noise cancellation technique in the analog-to-digital converter stage associated with FIG. 3, according to various embodiments.

FIG. 3 is a schematic representation of a sampling phase of an embodiment of an example noise cancellation technique in a first ADC stage 100. FIG. 4 is a schematic representation of a residue generation phase of the embodiment of the example noise cancellation technique in first ADC stage 100 associated with FIG. 3. For ease of discussion, physical elements that tie the components of FIGS. 3 and 4 to the sampling phase and the residue generation phase are not shown.

FIG. 3 shows an input voltage, $V_{in}$, at input 102 that is coupled to an input capacitor C by a closed switch $S_2$, where input capacitor C is coupled to an input of amplifier 110, which has a gain factor A. Amplifier 110 can be implemented as a residue amplifier or a comparator pre-amplifier. Input capacitor C and the input to amplifier 110 are also coupled to a band-limiting resistor $R_{BW}$ that is coupled to a reference by switch S1. Resistor Rbw can be implemented as other than a discrete resistor in the integrated circuit, for example, it can be the resistance of the switch S1. In the drawings it is introduced for the purpose of showing that the resistance on the right hand side of the capacitor dominates the series resistance. Thus, the predominant noise source will be on the right hand side of the capacitor C before the amplifier 110. The noise of $R_{BW}$ and S1 is represented as a sampling noise voltage $V_{N1}$ to the input of amplifier 110. In the example of FIG. 3, it can be assumed that the noise of $R_{BW}$ and the resistance $R_{S1}$ of switch S1 dominates the sampling noise of resistance $R_{S2}$ of switch S2, that is the value of $R_{BW}+R_{ST}$ is much greater than $R_{S2}$, and that the bandwidth of the amplifier 110 is wide enough to allow the tracking of $V_{N1}$. A factor associated with much greater than can be a factor of ten, a hundred, a thousand, or larger.

During the signal sampling phase, amplifier 110 is connected to the right-hand side of sampling input capacitor C at node 101 and can operate in auto-zero mode. An auto-zero mode is a mode of operation in which an input offset voltage of an amplifier is reduced or cancelled. In some configurations, the right-hand side 101 of sampling input capacitor C is referred to as a top plate of sampling input capacitor C. At this point in the signal sampling phase with the voltage across the sampling input capacitor C being $V_{IN}-V_{N1}$, the inputs of the amplifier 110 will be exposed to the thermal noise $V_{N1}$. Amplifier 110 scales this voltage $V_{N1}$ by the gain factor A, producing a voltage $AV_{N1}$ at the output of amplifier 110.

With the output of amplifier 110 coupled to an auto-zero capacitor $C_{AZ}$ with the auto-zero capacitor $C_{AZ}$ coupled to a reference by a closed auto-zero switch $S_{AZ}$, the voltage across $C_{AZ}$ is equal to $AV_{N1}$. The reference can be ground or some other low impedance node. The right-hand side of $C_{AZ}$ is connected to a top of switch $S_{AZ}$, opposite the reference to which switch $S_{AZ}$ is connected, and to an output 107 of this stage that can be coupled to a second stage. At the end of the sampling phase, the top plate switch $S_1$ and the amplifier auto-zero switch $S_{AZ}$ are actuated by the same signal for correlated action. This signal can be generated from a control circuit to switches $S_1$ and $S_{AZ}$, though such a control circuit is not shown in FIG. 3 or other figures for ease of discussion.

Switches $S_1$, $S_{AZ}$ and other switches, discussed herein, can be implemented in a number of ways convenient for integrated circuit construction, for example, but not limited to, transistors arranged to be selectable between an on-mode or an off-mode. The correlated action can be implemented in order to capture the noise on the input capacitor C and auto-zero capacitor $C_{AZ}$. This capture can essentially be a simultaneous capture, with possible small variation from simultaneous capture, since there can be a fractional delay between the two instances. After opening all switches $S_1$, $S_2$, and $S_{AZ}$ with switches $S_1$ and $S_{AZ}$ opened with the same signal, the circuit will have stored, on the output capacitor $C_{AZ}$, a scaled version, $AV_{N1}$, of the noise corrupting the signal sampled in the input capacitor C.

After first ADC stage 100 has completed the numerical conversion of the sampling phase, the switches $S_1$, $S_2$, and $S_{AZ}$ are in an open state and the left-hand side of input capacitor C is coupled to a closed switch $S_3$ for a residue generation phase. In this phase, the left-hand side of the input capacitor C can be presented with the quantized representation ($V_{DAC}$) of the input voltage $V_{IN}$, from a DAC, via closed switch $S_3$ coupled to the input 103 that receives $V_{DAC}$. Though not shown in FIGS. 3 and 4, the left-hand side of input capacitor C can be coupled to both switch $S_2$ and switch $S_3$, where control logic can provide open/close signals to switch $S_2$ and switch $S_3$ in a complementary manner in specified time periods. The voltage at node 101 of the right-hand side of input capacitor C now becomes $V_{DAC} - V_{IN} + V_{N1}$ with switch $S_3$ closed and switch $S_2$ open. The output of amplifier 110 can produce a voltage equal to $A(V_{DAC} - V_{IN} + V_{N1})$. Since at the end of the sampling phase, the voltage across $C_{AZ}$ was $AV_{N1}$, with polarity opposite the output of amplifier 110, as shown in FIGS. 3 and 4, the voltage on the right-hand-side of the auto-zero capacitor $C_{AZ}$, coupled to open switch $S_{AZ}$ and output 107 of first ADC stage 100, then becomes $A(V_{DAC} - V_{IN})$. Thus, the kT/C noise of the input sampling structure is cancelled out. The noise of amplifier 110 and noise of output sampling structure (auto-zero) are ignored in the description above as they would exist, regardless, and their magnitude is not affected by the cancellation mechanism.

FIGS. 3 and 4 provide a single ended case for simplicity of discussion. For the considerations below, the amplifier is assumed to be an operational transconductance amplifier with a unity gain bandwidth equal to $$\frac{g_m}{2\pi C_L},$$

where $g_m$ is the transconductance of the amplifier and $C_L$ is the load capacitance, represented by $C_{AZ}$ in FIGS. 3 and 4. In this example, the auto-zero bandwidth can be larger than the bandwidth of the input signal to capture the noise during the acquisition, which includes noise generated by $R_{BW}$ and resistance $R_{S1}$ of the switch $S_1$:

$$\frac{1}{2\pi R_{in} C} \ll \frac{g_m}{2\pi C_{az} A},$$

where $R_{in}$ is the sum of $R_{BW}$, $R_{S1}$, and $R_{S2}$, with $g_m$ being the transconductance of amplifier 110. The sampling noise can be bigger than the noise of $C_{AZ}$:

$$\frac{KT}{C} \gg \frac{4}{3} \frac{KT}{C_{az} A} \rightarrow \frac{C}{C_{az}} \ll \frac{3}{4} A.$$

Combining the above two expressions, the following results:

$$R_{in} g_m \gg \frac{4}{3}.$$

The above noise cancellation technique and noise cancellation structure is described from the perspective of first ADC stage 100, but this technique and structure can also be used in a number of configurations. For example, the noise cancellation technique/structure can be implemented in any stage of a multi-stage ADC. Amplifier 110 can be implemented as a residue amplifier or replaced with a pre-amplifier of a comparator. Amplifier 110 can be replaced with a pre-amplifier of an integrating residue amplifier. The noise cancellation technique/structure can be implemented in any switched capacitor circuit that involves a sampling capacitor and amplifier with or without a feedback loop. For simplicity, the circuit in FIGS. 3 and 4 were presented in single-ended configuration, but it can be used in differential configuration.

Figure 5:
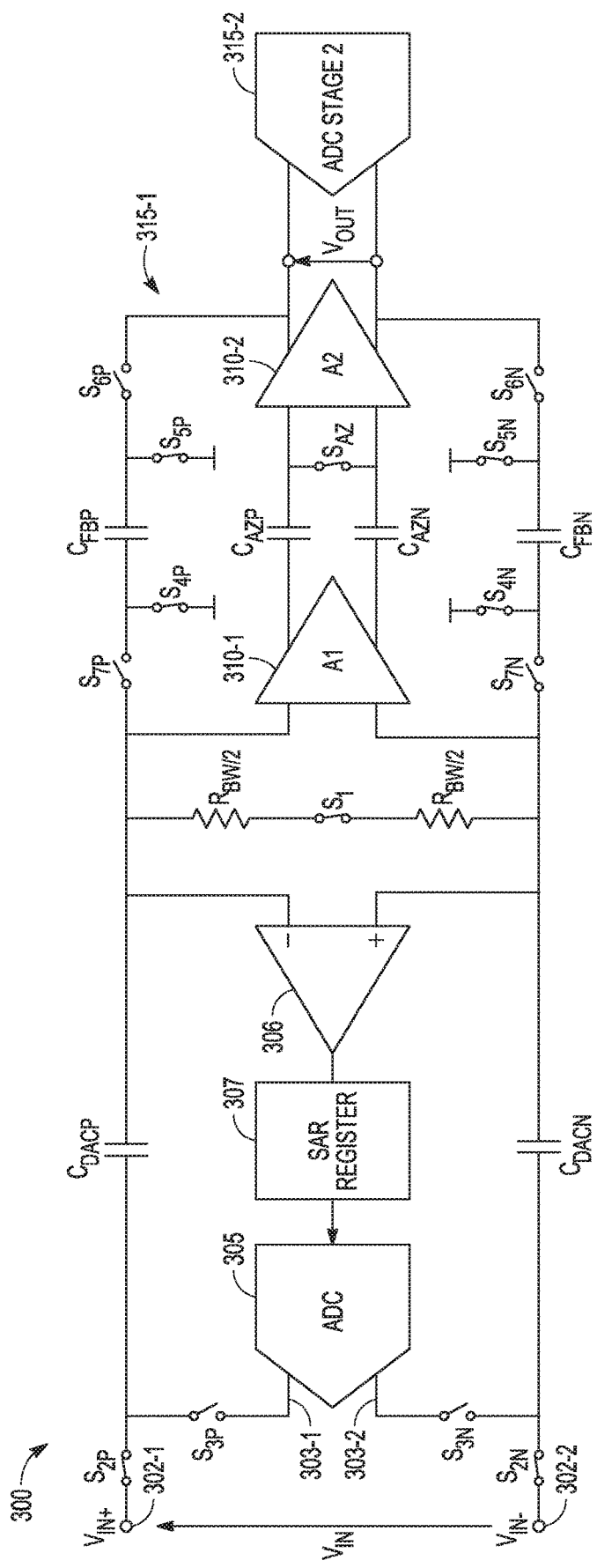
FIG. 5 is a schematic representation of an example differential implementation for a two-stage successive approximation register analog-to-digital converter stage, according to various embodiments.

FIG. 5 is a schematic representation of an embodiment of an example differential implementation for a two-stage SAR ADC 300. Though a two-stage structure is shown in FIG. 5, practical implementations can be extended for a multi-stage SAR converter. Two-stage SAR ADC 300 includes a first ADC stage 315-1 and a second ADC stage 315-2. First ADC stage 315-1 can include a positive rail with input 302-1 for $V_{IN+}$ and a negative rail with input 302-2 for $V_{IN-}$ for an input signal $V_{IN}$ between 302-1 and 302-2. During the acquisition phase, switches $S_{2P}$, $S_{2N}$, $S_{3P}$, $S_{3N}$, $S_1$, $S_{7P}$, $S_{7N}$, $S_{4P}$, $S_{4N}$, $S_{5P}$, $S_{5N}$, $S_{6P}$, and $S_{6N}$ are configured as shown in FIG. 5. During acquisition, the circuit works in a similar manner to first ADC stage 100 of FIG. 3.

Similar to FIG. 3, input 302-1 for $V_{IN+}$ is coupled to the sampling capacitor $C_{DAP}$ by closed switch $S_{2P}$ and input 302-2 for $V_{IN-}$ is coupled to the sampling capacitor $C_{DACN}$ by closed switch $S_{2N}$. Sampling capacitor $C_{DACP}$ is coupled to an input of amplifier 310-1, where amplifier has a gain factor A1, and to a band-limiting resistor having resistance $R_{BW/2}$. Sampling capacitor $C_{DACN}$ is coupled to another input of amplifier 310-1 and to another band-limiting resistor having resistance $R_{BW/2}$. In this example, the value of the two band-limiting resistors are equal. With switch $S_1$ closed the noise voltage of top resistance having value of $R_{BW/2}$, bottom resistance having value of $R_{BW/2}$, and noise of switch $S_1$ are presented to amplifier 310-1. Amplifier 310-1 scales the noise input and presents the scaled noise at two outputs: one to the designated positive auto-zero capacitor, $C_{AZP}$, and one to the designated negative auto-zero capacitor, $C_{AZN}$. With switch $S_{AZ}$ closed, the voltages across $C_{AZP}$ and $C_{AZN}$ are the captured scaled noise. Rather than a reference, such as ground or other low impedance node, switch $S_{AZ}$ is coupled between end of $C_{AZP}$ and an end of $C_{AZN}$. One end of switch $S_{AZ}$ is coupled to an input of an amplifier 310-2 and the other end of switch $S_{AZ}$ is coupled to another input of amplifier 310-2. Amplifier 310-2 has a gain factor A2. An output voltage $V_{OUT}$ can be taken between two outputs of amplifier 310-2. These two outputs of amplifier 310-2 can be coupled to second ADC stage 315-2.

In this example embodiment, first ADC stage 315-1 includes feedback capacitors, $C_{FBP}$ and $C_{FBN}$. In the acquisition stage, $C_{FBP}$ is coupled to a reference, such as ground or other low impedance node, by closed switches $S_{4P}$ and $S_{5P}$, while $C_{FBN}$ is coupled to a reference, such as ground or other low impedance node, by closed switches $S_{4N}$ and $S_{5N}$. $C_{FBP}$ is uncoupled from an input of amplifier 310-1 by open switch $S_{7P}$ and is uncoupled from an output of amplifier 310-2 by open switch $S_{6P}$. $C_{FBN}$ is uncoupled from the other input of amplifier 310-1 by open switch $S_{7N}$ and is uncoupled from the other output of amplifier 310-2 by open switch $S_{6N}$. Thus, are isolated from the noise capture process.

During the residue amplification phase, the position of each of the switches is complemented, which means that closed switches are opened, and open switches are closed. The voltages at the end of sampling capacitors $C_{DACP}$ and $C_{DACN}$ are amplified to comparator 306 whose output is coupled to a SAR register 307 that feeds s DAC 305. With correlated switching, an output signal of DAC 305 at output 303-1 is provided to sampling capacitors $C_{DACP}$ via closed switch $S_{3P}$, and another output signal of DAC 305 at output 303-2 is provided to sampling capacitors $C_{DACN}$ via closed switch $S_{3N}$. The residue charge of first ADC stage 315-1 is scaled via the feedback capacitors $C_{FBP}$ and $C_{FBN}$. The voltage $V_{OUT}$ produced at the output of amplifier 310-2 of first ADC stage 315-1 equals:

$$V_{OUT} = (V_{DAC} - V_{IN}) * \frac{C_{DAC}}{C_{FB}}.$$

Figure 6:
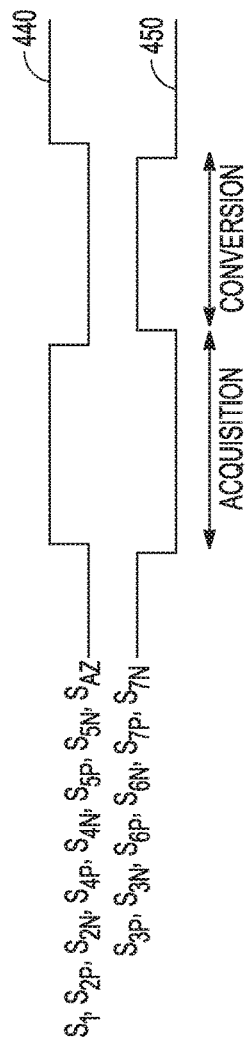
FIG. 6 illustrates example signals provided to the switches of the two-stage successive approximation register analog-to-digital converter stage of FIG. 5, according to various embodiments.

FIG. 6 illustrates an embodiment of example signals provided to the switches of two-stage SAR ADC 300 of FIG. 5. Signal 440 is provided to switches $S_1$, $S_{2P}$, $S_{2N}$, $S_{4P}$, $S_{4N}$, $S_{5P}$, $S_{5N}$, and $S_{AZ}$ during the acquisition and conversion phases. With signal 440 high, these switches are closed for acquisition, and these switches are open for conversion when signal 440 is low. Signal 450 is provided to switches $S_{3P}$, $S_{3N}$, $S_{6P}$, $S_{6N}$, $S_{7P}$, and $S_{7N}$ during the acquisition and conversion phases. With signal 450 low, these switches are open for acquisition, and these switches are closed for conversion when signal 450 is high.

Figure 7:
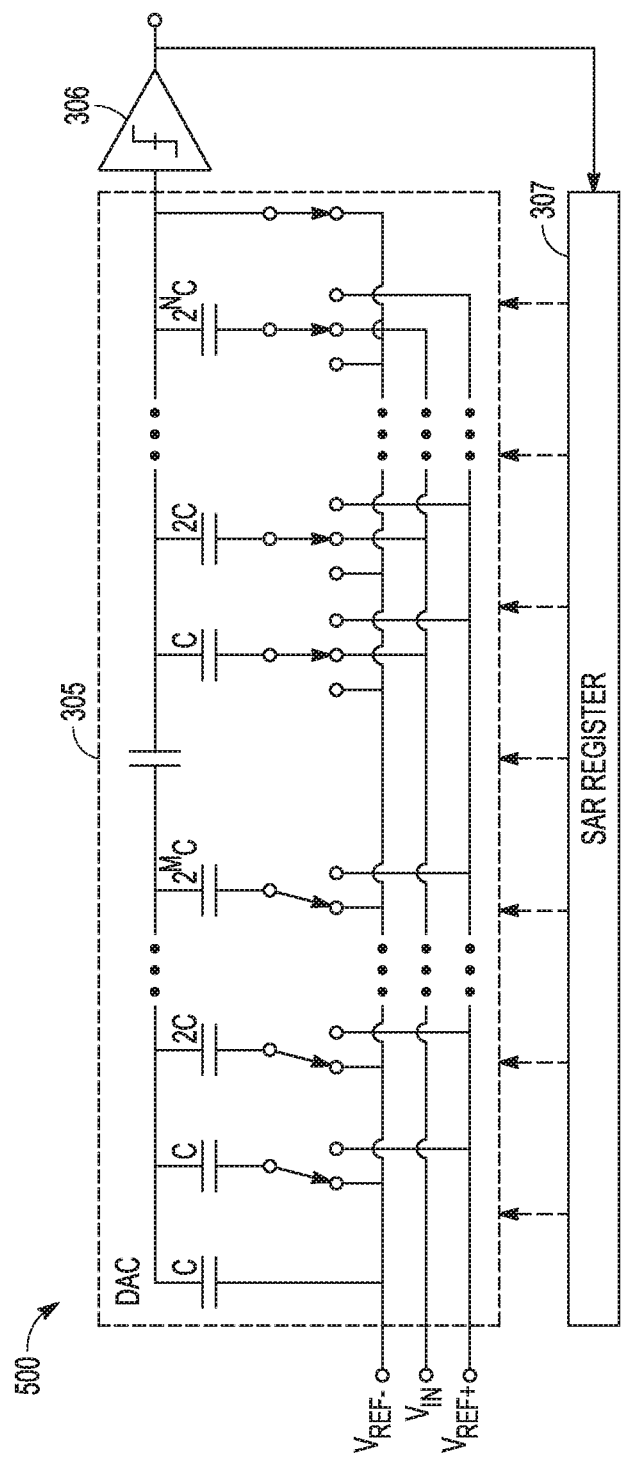
FIG. 7 is a representation of a successive approximation register converter that can be adapted for application in noise cancellation architectures, according to various embodiments.

FIG. 7 is a representation of a SAR converter 500 that can be adapted for SAR register 307 and DAC 305 of first stage ADC 315-1 of two-stage SAR ADC 300 of FIG. 5. Sampling charge redistribution DAC 305 is arranged to receive input from SAR register 307 and provide an output to comparator 306. In this example, an left capacitor terminal can selectively be switched to $V_{IN}$, a negative reference $V_{REF-}$ or a positive reference $V_{REF+}$ via a set of switches that can be controlled by SAR logic, in order to sample the signal and produce the $V_{DAC}$ voltage during the conversion phase.

Figure 8:
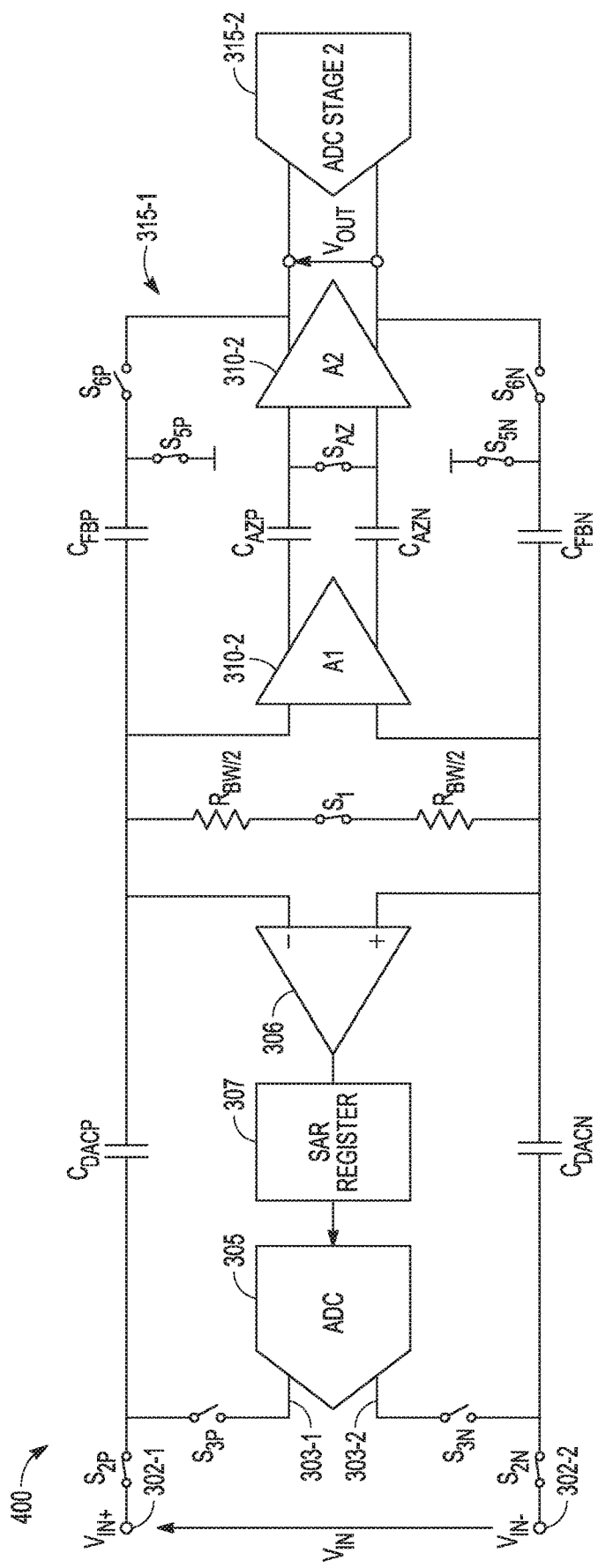
FIG. 8 is a schematic representation of an example differential implementation for a two-stage successive approximation register analog-to-digital converter, which has the structure of the example differential implementation for the two-stage successive approximation register analog-to-digital converter of FIG. 5 in which several switches are omitted, according to various embodiments.

FIG. 8 is a schematic representation of an embodiment of an example differential implementation for a two-stage SAR ADC 400, which has the structure of the example differential implementation for two-stage SAR ADC 300 of FIG. 5 in which two switches in each of the positive and negative path are omitted. Switches $S_{7P}$, $S_{7P}$, $S_{4P}$, and $S_{4N}$ are omitted, which directly connects the feedback capacitors $C_{FBP}$ and $C_{FBN}$ to the inputs of amplifier 310-1. This can provide for better noise cancellation, which is otherwise limited by the feedback ratio shown above in the discussion of FIG. 5. This enhanced noise cancellation comes at the cost of extra load capacitance and charge disturbance on $S_1$ during the acquisition phase.

Figure 9:
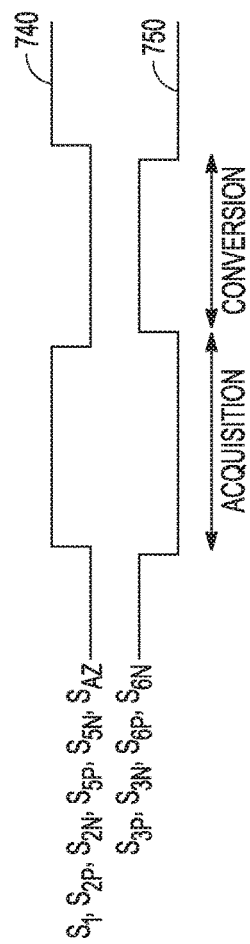
FIG. 9 illustrates example signals provided to the switches of the two-stage successive approximation register analog-to-digital converter of FIG. 8, according to various embodiments.

FIG. 9 illustrates an embodiment of example signals provided to the switches of two-stage SAR ADC 400 of FIG. 8. Signal 740 is provided to switches $S_1$, $S_{2P}$, $S_{2N}$, $S_{5P}$, $S_{5N}$, and $S_{AZ}$ during the acquisition and conversion phases. With signal 740 high, these switches are closed for acquisition, and these switches are open for conversion when signal 740 is low. Signal 750 is provided to switches $S_{3P}$, $S_{3N}$, $S_{6P}$, and $S_{6N}$ during the acquisition and conversion phases. With signal 750 low, these switches are open for acquisition, and these switches are closed for conversion when signal 750 is high.

The settling of an input signal for an RC sampling structure is described by an exponential equation:

$$V_C(t)=V_{IN}+(V_C(t_0)-V_{IN})e^{-t/RC},$$

where $V_C(t_0)$ is the capacitor voltage at the beginning of the input phase, $V_{IN}$ is the input voltage (assumed constant for simplicity), t is the time duration of the input signal acquisition, and R is the total resistance in series with the capacitor (C). From this, it can be seen that, if $R_{BW}$ is made very large in the example of FIGS. 3, 4, 5, and 8, the input signal will not be acquired accurately. Once again, a large $R_{BW}$ with respect to $R_{S2}$ of switch $S_2$ in FIGS. 3-5 and 8 is desirable such that the noise on the right-hand side of the input capacitor dominates the sampling noise (kT/C).

In order to avoid incomplete settling of the signal during acquisition, the bandwidth of the sampling structure can be varied during the acquisition phase. This would allow for a fast settling of the signal at the beginning of the acquisition phase, followed by a noise tracking/cancellation, with nominal bandwidth that is most suited for the signal and circuit.

Figure 10:
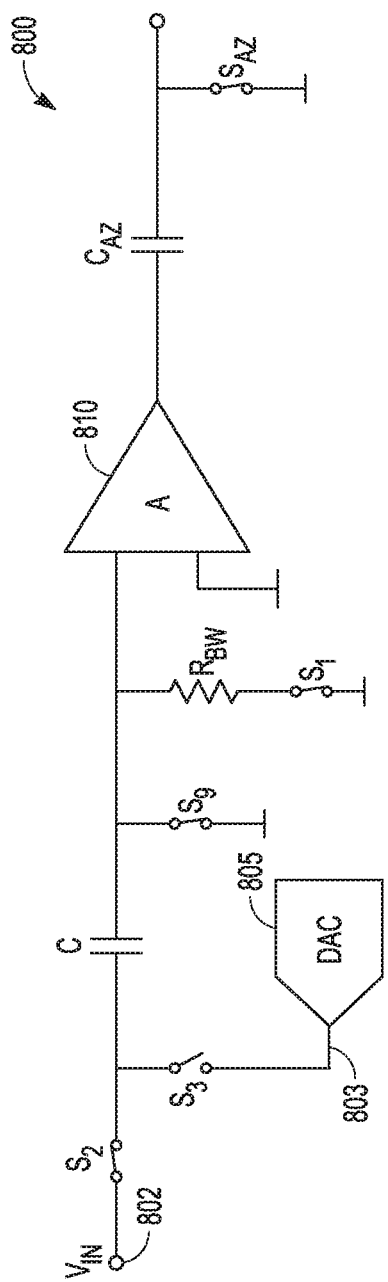
FIG. 10 is an illustration of an example variable sampling bandwidth implementation, according to various embodiments.

FIG. 10 is an illustration of an embodiment of an example variable sampling bandwidth implementation 800. Switch $S_9$ is introduced in parallel with $R_{BW}$ and $S_1$ in the arrangement of first ADC stage 100 of FIGS. 3 and 4, allowing for a wider sampling bandwidth for the first part of the acquisition period. FIG. shows the implementation 800 in an acquisition phase with V coupled by closed switch $S_2$ to the sampling capacitor C, where switch $S_3$ is open such that the output 803 of DAC 805 is uncoupled from the sampling capacitor C. With switches $S_1$ and $S_{AZ}$ closed, the voltage $V_{N1}$ is presented to amplifier 810, having gain factor A, the scaled voltage $AV_{N1}$ captured by capacitor $C_{AZ}$ at the output of amplifier.

Figure 11:
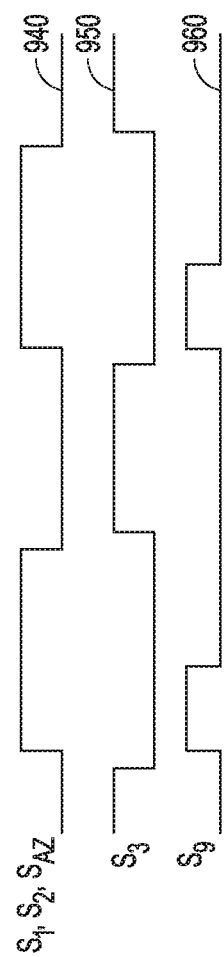
FIG. 11 illustrates example signals provided to the switches of the implementation of FIG. 10, according to various embodiments.

FIG. 11 illustrates an embodiment of example signals provided to the switches of implementation 800 of FIG. 10. Signal 940 is provided to switches $S_1$, $S_2$, and $S_{AZ}$ during the acquisition and conversion phases. With signal 940 high, these switches are closed for acquisition, and these switches are open for conversion when signal 940 is low. Signal 950 is provided to switch $S_3$ during the acquisition and conversion phases. With signal 950 low, switch $S_3$ is open for acquisition, and is closed for conversion when signal 950 is high. Signal 960 is provided to switch $S_9$ during the acquisition and conversion phases, which allows for a wider sampling bandwidth for the first part of the acquisition period. Switch $S_9$ is changed from its open position to its closed position when switches $S_1$, $S_2$, and $S_{AZ}$ changed from their open positions to their closed positions. Switch $S_9$ is changed from its closed position to its open position, while switches $S_1$, $S_2$, and $S_{AZ}$ remain their closed positions. Switch $S_9$ is again changed from its open position to its closed position when switches $S_1$, $S_2$, and $S_{AZ}$ are again changed from their open positions to their closed positions.

The structures and signals of FIGS. 3-11 illustrate a noise reduction technique for an electronic capacitive sampling structure that can be applied in a number of architectures. A first example capacitive signal sampling circuit with reduced noise can comprise: an input node that in use receives a voltage signal; a switch connected to the input node and a second node; a switch connected between the second node and a low impedance node; a capacitor connected between the second node and a third node; a switch connected between the third node and a low impedance node; an amplifier having an input connected to the third node; and a voltage sampling structure at the output of the amplifier, in which these components are arranged such that during a signal acquisition phase, the circuit tracks the input voltage and the switch on the right-hand side of the input capacitor is closed, which is conveniently sized to dominate the noise sampled on the input capacitor at the end of the acquisition phase. The amplifier output produces a scaled version of the voltage across the switch connected to its input coupled to the third node. The switch connected to the input of the amplifier can be actuated synchronously with the switching circuitry of the sampling structure connected to the output of the amplifier.

Example capacitive signal sampling circuits can be realized as variations of the first example capacitive signal sampling circuit. For example, variations of the first example capacitive signal sampling circuit can be structured as a stage of an analog-to-digital converter. For such a structure, the sampling structure at the output of the amplifier can be part of a second analog-to-digital converter. These variations of the first example capacitive signal sampling circuit can include another charge redistribution structure connected at the third node, which is the amplifier input node.

The input capacitor of a variation of the first example capacitive signal sampling circuit can be formed of an array of capacitors. The array of capacitors can form a sampling charge redistribution DAC, where the left-hand side of the capacitor array can be selectively connected between the input node and voltage reference nodes. A variation of the first example capacitive signal sampling circuit can include, the during the acquisition phase, operating with the bandwidth of the input sampling structure being variable.

A variation of the first example capacitive signal sampling circuit can include a second switch that is connected in parallel with the switch connected at the input of the amplifier, which is open before the switch is connected at the input of the amplifier. Variations of the first example capacitive signal sampling circuit can include the amplifier realized in a number of different implementations. The amplifier can be a stage of a multi-stage amplifier. The amplifier can be a stage of a closed loop amplifier. Such a structure can include feedback via capacitors. The amplifier can be a stage of an integrator. The amplifier can be a stage of a comparator.

A variation of the first example capacitive signal sampling circuit can include an auxiliary circuit introduced to reduce the variation of the signal at node 3, which is the input of the amplifier. A variation of the first example capacitive signal sampling circuit can include two or more stages, where each stage is structured similar or identical to the first example capacitive signal sampling circuit. A variation of the first example capacitive signal sampling circuit can include the bandwidth of the amplifier and output sampling structure conveniently configured to give maximum noise rejection.

Figure 12:
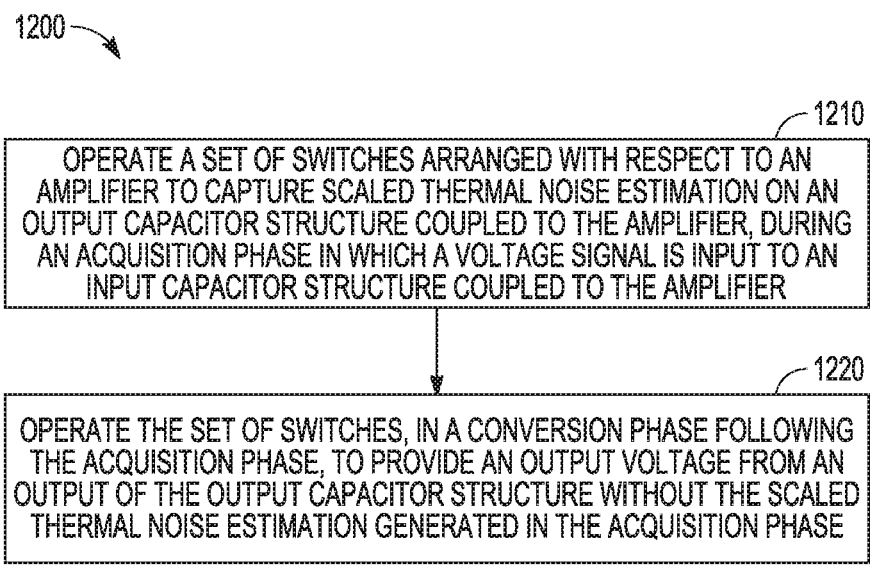
FIG. 12 is a flow diagram of a features of an example of an example method of noise reduction in a sampling structure, according to various embodiments.

FIG. 12 is a flow diagram of features of an embodiment of an example method 1200 of noise reduction in a sampling structure. At 1210, a set of switches arranged with respect to an amplifier are operated to capture scaled thermal noise estimation on an output capacitor structure coupled to the amplifier. The capture of the scaled thermal noise estimation is conducted during an acquisition phase in which a voltage signal is input to an input capacitor structure coupled to the amplifier. At 1220, the set of switches are operated, in a conversion phase following the acquisition phase, to provide an output voltage from an output of the output capacitor structure without the scaled thermal noise estimation generated in the acquisition phase.

Variations of method 1200 or methods similar to method 1200 can include a number of different embodiments that may be combined depending on the application of such methods and/or the architecture of systems in which such methods are implemented. Such methods can include actuating a first switch and a second switch of the set of switches in a correlated manner to a close position in the acquisition phase and actuating, in another correlated manner, the first switch and the second switch to an open position in the conversion phase. Such methods can include controlling a third switch in a closed position for a portion of time that the first switch is in a closed position to vary a sampling bandwidth in the acquisition phase.

Variations of method 1200 or methods similar to the method 1200 can include controlling a fourth switch to couple a digital-to-analog converter to the input capacitor structure such that the fourth switch is opened before the first switch closes and the fourth switch closes after the first switch opens. Variations of method 1200 or methods similar to the method 1200 can include receiving the output voltage from the output of the output capacitor structure at an input of a second amplifier; and providing a second output voltage from the second amplifier to an input of an analog-to-digital stage, in response to generating the output voltage at the output of the output capacitor structure in the conversion phase following the acquisition phase.

In various embodiments, a device, having a capacitive sampling structure, can comprise: an amplifier having an amplifier input and an amplifier output; an input capacitor structure coupled to the amplifier input; an output capacitor structure coupled to the amplifier output; and a set of switches arranged with respect to the amplifier. The set of switches can be operated such that, in switching, scaled thermal noise is captured on the output capacitor structure in an acquisition phase, and, in a conversion phase, the captured thermal noise is canceled or compensated from an output of the output capacitor structure. The scaled thermal noise can be generated in the acquisition phase in which a voltage signal is input to the input capacitor structure. The set of switches can include a first switch arranged on an input side of the amplifier and a second switch arranged on the output side of the amplifier, with the first and second switches arranged for correlated actuation.

Variations of such a device or similar devices can include a number of different embodiments that may be combined depending on the application of such devices and/or the architecture of systems in which such devices are implemented. The device can include the first switch coupled to a resistor with the resistor coupled to the input capacitor structure and to the amplifier. The set of switches can include a third switch in parallel with the first switch coupled to the resistor such that, in the acquisition phase, the third switch is controlled to vary bandwidth associated with the input capacitor structure and the resistor. Variations of such a device or similar devices can include a fourth switch to couple a digital-to-analog converter to the input capacitor structure with the fourth switch arranged to open before the first switch closes and to close after the first switch opens.

Variations of such a device or similar devices can include the amplifier, the input capacitor structure, the output capacitor structure and the set of switches structured as a stage of an analog-to-digital converter. The amplifier can be one of a stage of a multi-stage amplifier, a stage of a closed loop amplifier, a stage of an integrator, and a stage of a comparator. In various embodiments, the input capacitor structure can be an array of capacitors. The array of capacitors can form a sampling charge redistribution digital-to-analog converter with one or more capacitors of the array arranged to selectively couple between an input voltage node and one or more voltage reference nodes.

Variations of such a device or similar devices can include a second input capacitor structure coupled to the amplifier at a second input different from a first input at which the input capacitor structure is coupled to the amplifier; a second output capacitor structure coupled to the amplifier at a second output different from a first output at which the output capacitor structure is coupled to the amplifier; and a second amplifier coupled to the output capacitor structure at a first input of the second amplifier and coupled to the second output capacitor structure at a second input of the second amplifier. Variations can include the device including one or more feedback capacitors coupled between the second amplifier and the amplifier using one or more switches along two paths of the device configured with a differential input structure between the first input capacitor structure and the second input capacitor structure.

Variations of such a device or similar devices, having a capacitive sampling structure, can include the set of switches having: a first switch arranged on an input side of the amplifier with the first switch coupled to a first resistor with the first resistor coupled to the input capacitor structure and to the first input of the amplifier and with the first switch coupled to a second resistor with the second resistor coupled to the second input capacitor structure and to the second input of the amplifier; and a second switch arranged on the output side of the amplifier with the second switch coupled to the output capacitor structure and to the second output capacitor structure, with the second switch arranged with the first switch for correlated actuation.

In various embodiments, a device, having a capacitive sampling structure, can comprise: a first means for storing charge; a second means for storing charge; a means for amplifying a signal; a means for capturing thermal noise on an input of the means for amplifying a signal during an acquisition phase in which a voltage signal is input to the first means for storing charge; and a means for cancelling scaled thermal noise, generated during the acquisition phase from the means for amplifying a signal, from an output of the second means for storing charge during a conversion phase.

Variations of such a device or similar devices can include a number of different embodiments that may be combined depending on the application of such devices and/or the architecture of systems in which such devices are implemented. The device can include the means for capturing thermal noise being arranged on an input side of the means for amplifying a signal and the means for cancelling scaled thermal noise is arranged on the output side of the means for amplifying a signal, with the means for capturing thermal noise and the means for cancelling scaled thermal noise arranged for simultaneous actuation. Such devices can include a means for varying a sampling bandwidth during the acquisition phase.

The following are example embodiments of switched capacitor circuits and associated methods, in accordance with the teachings herein. Such architectures and methods allow for removing sampling noise in charge redistribution circuits. Such charge redistribution circuits can include, but are not limited to, analog to digital converters.

An example device 1, having a capacitive sampling structure, can comprise: an amplifier having an amplifier input and an amplifier output: an input capacitor structure coupled to the amplifier input; an output capacitor structure coupled to the amplifier output; and a set of switches arranged with respect to the amplifier such that, in switching, scaled thermal noise, generated in an acquisition phase in which a voltage signal is input to the input capacitor structure, is captured on the output capacitor structure and, in a conversion phase, the captured thermal noise is canceled or compensated from an output of the output capacitor structure.

An example device 2, having a capacitive sampling structure, can include features of example device 1 and can include the set of switches including a first switch arranged on an input side of the amplifier and a second switch arranged on the output side of the amplifier, with the first and second switches arranged for correlated actuation.

An example device 3, having a capacitive sampling structure, can include features of example device 2 or features of any of the preceding example devices and can include the first switch is coupled to a resistor with the resistor coupled to the input capacitor structure and to the amplifier.

An example device 4, having a capacitive sampling structure, can include features of example device 3 or features of any of the preceding example devices and can include the set of switches including a third switch in parallel with the first switch coupled to the resistor such that, in the acquisition phase, the third switch is controlled to vary bandwidth associated with the input capacitor structure and the resistor.

An example device 5, having a capacitive sampling structure, can include features of example device 2 or features of any of the preceding example devices and can include another switch to couple a digital-to-analog converter to the input capacitor structure with the other switch arranged to open before the first switch closes and to close after the first switch opens.

An example device 6, having a capacitive sampling structure, can include features of any of the preceding example devices and can include the amplifier, the input capacitor structure, the output capacitor structure and the set of switches being structured as a stage of an analog-to-digital converter.

An example device 7, having a capacitive sampling structure, can include features of any of the preceding example devices and can include the input capacitor structure being an array of capacitors.

An example device 8, having a capacitive sampling structure, can include features of example device 7 or features of any of the preceding example devices and can include the array of capacitors forming a sampling charge redistribution digital-to-analog converter with one or more capacitors of the array arranged to selectively couple between an input voltage node and one or more voltage reference nodes.

An example device 9, having a capacitive sampling structure, can include features of any of the preceding example devices and can include the amplifier being one of a stage of a multi-stage amplifier, a stage of a closed loop amplifier, a stage of an integrator, and a stage of a comparator.

An example device 10, having a capacitive sampling structure, can include features of any of the preceding example devices and can include a second input capacitor structure coupled to the amplifier at a second input different from a first input at which the input capacitor structure is coupled to the amplifier; a second output capacitor structure coupled to the amplifier at a second output different from a first output at which the output capacitor structure is coupled to the amplifier; and a second amplifier coupled to the output capacitor structure at a first input of the second amplifier and coupled to the second output capacitor structure at a second input of the second amplifier.

An example device 11, having a sampling structure, can include features of example device 10 or features of any of the preceding example devices and can include the device including one or more feedback capacitors coupled between the second amplifier and the amplifier using one or more switches along two paths of the device configured with a differential input structure between the first input capacitor structure and the second input capacitor structure.

An example device 12, having a sampling structure, can include features of example device 10 or features of any of the preceding example devices and can include the set of switches including: a first switch arranged on an input side of the amplifier with the first switch coupled to a first resistor with the first resistor coupled to the input capacitor structure and to the first input of the amplifier and with the first switch coupled to a second resistor with the second resistor coupled to the second input capacitor structure and to the second input of the amplifier; and a second switch arranged on the output side of the amplifier with the second switch coupled to the output capacitor structure and to the second output capacitor structure, with the second switch arranged with the first switch for correlated actuation.

An example device 13, having a sampling structure, can comprise: a first means for storing charge; a second means for storing charge; a means for amplifying a signal; a means for capturing thermal noise on an input of the means for amplifying a signal during an acquisition phase in which a voltage signal is input to the first means for storing charge; and a means for cancelling scaled thermal noise, generated during the acquisition phase from the means for amplifying a signal, from an output of the second means for storing charge during a conversion phase.

An example device 14, having a capacitive sampling structure, can include features of example device 13 and can include the means for capturing thermal noise being arranged on an input side of the means for amplifying a signal and the means for cancelling scaled thermal noise is arranged on the output side of the means for amplifying a signal, with the means for capturing thermal noise and the means for canceling scaled thermal noise arranged for simultaneous actuation.

An example device 15, having a capacitive sampling structure, can include features of example devices 13 and 14 and can include a means for varying a sampling bandwidth during the acquisition phase.

An example method 1 of noise reduction in a sampling structure can comprise: operating a set of switches arranged with respect to an amplifier to capture scaled thermal noise estimation on an output capacitor structure coupled to the amplifier, during an acquisition phase in which a voltage signal is input to an input capacitor structure coupled to the amplifier; and operating the set of switches, in a conversion phase following the acquisition phase, to provide an output voltage from an output of the output capacitor structure without the scaled thermal noise estimation generated in the acquisition phase.

An example method 2 of noise reduction in a sampling structure can include features of example method 1 and can include correlated actuating of a first switch and a second switch of the set of switches to a close position in the acquisition phase and correlated actuating of the first switch and the second switch to an open position in the conversion phase.

An example method 3 of noise reduction in a sampling structure can include features of example method 2 or features of any of the preceding example methods and can include controlling a third switch in a closed position for a portion of time that the first switch is in a closed position to vary a sampling bandwidth in the acquisition phase.

An example method 4 of noise reduction in a sampling structure can include features of example method 2 or features of any of the preceding example methods and can include controlling another switch to couple a digital-to-analog converter to the input capacitor structure such that the other switch is opened before the first switch closes and the third switch closes after the first switch opens.

An example method 5 of noise reduction in a sampling structure can include features of any of the preceding example methods and can include receiving the output voltage from the output of the output capacitor structure at an input of a second amplifier; and providing a second output voltage from the second amplifier to an input of an analog-to-digital stage, in response to generating the output voltage at the output of the output capacitor structure in the conversion phase following the acquisition phase.

An example method 6 of noise reduction in a sampling structure can include features of any of the preceding example methods of noise reduction in a sampling structure and can include performing functions associated with any features of example devices 1-15 having a capacitive sampling structure and any features of example devices associated with the figures herein.

The above detailed description refers to the accompanying drawings that show, by way of illustration and not limitation, various embodiments that can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The above detailed description is, therefore, not to be taken in a limiting sense.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A device having a capacitive sampling structure, the device comprising:
    an amplifier having an amplifier input and an amplifier output;

an input capacitor structure coupled to the amplifier input;
an output capacitor structure coupled to the amplifier output; and
a set of switches arranged with respect to the amplifier such that, in switching, scaled thermal noise, generated in an acquisition phase in which a voltage signal is input to the input capacitor structure, is captured on the output capacitor structure and, in a conversion phase, the captured thermal noise is canceled or compensated from an output of the output capacitor structure, the set of switches including:
a first switch arranged on an input side of the amplifier; and
a second switch arranged on the output side of the amplifier, with the first and second switches arranged for synchronous correlated actuation.

2. The device of claim 1, wherein the first switch is coupled to a resistor with the resistor coupled to the input capacitor structure and to the amplifier.

3. The device of claim 2, wherein the set of switches includes a third switch in parallel with the first switch coupled to the resistor such that, in the acquisition phase, the third switch is controlled to vary bandwidth associated with the input capacitor structure and the resistor.

4. The device of claim 1, wherein the device includes a third switch to couple a digital-to-analog converter to the input capacitor structure with the third switch arranged to open before the first switch closes and to close after the first switch opens.

5. The device of claim 1, wherein the amplifier, the input capacitor structure, the output capacitor structure, and the set of switches are structured as a stage of an analog-to-digital converter.

6. The device of claim 1, wherein the input capacitor structure is an array of capacitors.

7. The device of claim 6, wherein the array of capacitors forms a sampling charge redistribution digital-to-analog converter with one or more capacitors of the array arranged to selectively couple between an input voltage node and one or more voltage reference nodes.

8. The device of claim 1, wherein the amplifier is one of a stage of a multi-stage amplifier, a stage of a closed loop amplifier, a stage of an integrator, and a stage of a comparator.

9. The device of claim 1, wherein the device includes:
a second input capacitor structure coupled to the amplifier at a second input different from a first input at which the input capacitor structure is coupled to the amplifier;
a second output capacitor structure coupled to the amplifier at a second output different from a first output at which the output capacitor structure is coupled to the amplifier; and
a second amplifier coupled to the output capacitor structure at a first input of the second amplifier and coupled to the second output capacitor structure at a second input of the second amplifier.

10. The device of claim 9, wherein the device includes:
a comparator having a first comparator input coupled to the first input of the amplifier and a second comparator input coupled to the second input of the amplifier;
a successive approximation register (SAR) having a SAR input coupled to a comparator output of the comparator; and
an analog-to-digital converter (ADC) coupled to the SAR, coupled to the input capacitor structure via a third switch, and coupled to the second input capacitor structure via a fourth switch.

11. The device of claim 9, wherein the device includes one or more feedback capacitors coupled between the second amplifier and the amplifier using one or more switches along two paths of the device configured with a differential input structure between the first input capacitor structure and the second input capacitor structure.

12. The device of claim 9, wherein the set of switches includes:
the first switch coupled to a first resistor with the first resistor coupled to the input capacitor structure and to the first input of the amplifier and with the first switch coupled to a second resistor with the second resistor coupled to the second input capacitor structure and to the second input of the amplifier; and
the second switch coupled to the output capacitor structure and to the second output capacitor structure.

13. A method of noise reduction in a sampling structure, the method comprising:
operating a set of switches arranged with respect to an amplifier to capture scaled thermal noise estimation on an output capacitor structure coupled to the amplifier, during an acquisition phase in which a voltage signal is input to an input capacitor structure coupled to the amplifier;
operating the set of switches, in a conversion phase following the acquisition phase, to provide an output voltage from an output of the output capacitor structure without the scaled thermal noise estimation generated in the acquisition phase; and
synchronously actuating a first switch and a second switch of the set of switches, with the first switch arranged on an input side of the amplifier and the second switch arranged on an output side of the amplifier to control the acquisition phase and the conversion phase.

14. The method of claim 13, wherein the method includes correlated actuating of the first switch and the second switch to a close position in the acquisition phase and correlated actuating of the first switch and the second switch to an open position in the conversion phase.

15. The method of claim 14, wherein the method includes controlling a third switch in a closed position for a portion of time that the first switch is in a closed position to vary a sampling bandwidth in the acquisition phase.

16. The method of claim 14, wherein the method includes controlling a third switch to couple a digital-to-analog converter to the input capacitor structure such that the third switch is opened before the first switch closes and the third switch closes after the first switch opens.

17. The method of claim 13, wherein the method includes:
receiving the output voltage from the output of the output capacitor structure at an input of a second amplifier; and
providing a second output voltage from the second amplifier to an input of an analog-to-digital stage, in response to generating the output voltage at the output of the output capacitor structure in the conversion phase following the acquisition phase.

18. A device having a sampling structure, the device comprising:
a first means for storing charge;
a second means for storing charge;
a means for amplifying a signal;
a means for capturing thermal noise on an input of the means for amplifying a signal during an acquisition phase in which a voltage signal is input to the first means for storing charge, with the means for capturing thermal noise being arranged on an input side of the means for amplifying a signal; and a means for cancelling scaled thermal noise, generated during the acquisition phase from the means for amplifying a signal, from an output of the second means for storing charge during a conversion phase, with the means for cancelling scaled thermal noise arranged on the output side of the means for amplifying a signal, with the means for capturing thermal noise and the means for cancelling scaled thermal noise being arranged for synchronous correlated actuation.

19. The device of claim 18, wherein the device includes a third means for storing charge arranged with the first means for storing charge and the means for amplifying a signal in a differential implementation of a two-stage successive approximation register analog-to-digital converter stage.

20. The device of claim 18, wherein the device includes a means for varying a sampling bandwidth during the acquisition phase.

21. A device arranged for cancellation or compensation of scaled thermal noise in a conversion phase from capture of the scaled thermal noise in an acquisition phase, the device comprising:
an amplifier having an amplifier input and an amplifier output;
an input capacitor structure coupled to the amplifier input;
an output capacitor structure coupled to the amplifier output;
a first switch coupled to the amplifier input; and
a second switch coupled to the output capacitor structure with the output capacitor structure between the second switch and the amplifier output, with the first and second switches arranged for synchronous correlated actuation.

22. The device of claim 21, wherein the device includes the first switch coupled to the amplifier input by a resistor.

23. The device of claim 21, wherein the second switch is coupled to and between two inputs of a second amplifier, with the second amplifier having two outputs to provide an output signal.

24. The device of claim 21, wherein the device includes:
a third switch coupled to the input capacitor structure and to the amplifier input;
a fourth switch coupled to the input capacitor structure at an end of the input capacitor structure opposite the amplifier; and
a digital-to-analog converter coupled to the fourth switch at an end of the fourth switch opposite the input capacitor structure.

25. The device of claim 21, wherein the device includes a second input capacitor structure coupled to the amplifier at a second input different from a first input of the amplifier at which the input capacitor structure is coupled to the amplifier;
a second output capacitor structure coupled to the amplifier at a second output different from a first output of the amplifier at which the output capacitor structure is coupled to the amplifier with the second output capacitor structure coupled to the second switch at end of the second switch opposite the output capacitor structure; and
a comparator having a first comparator input coupled to the first input of the amplifier and a second comparator input coupled to the second input of the amplifier;
a successive approximation register (SAR) having a SAR input coupled to a comparator output of the comparator; and
an analog-to-digital converter (ADC) coupled to the SAR, coupled to the input capacitor structure via a third switch, and coupled to the second input capacitor structure via a fourth switch.

26. The device of claim 25, wherein the device includes a second amplifier coupled to the output capacitor structure at a first input of the second amplifier and coupled to the second output capacitor structure at a second input of the second amplifier; and
a set of feedback capacitors coupled between the second amplifier and the amplifier using one or more switches along two paths to the first and second inputs to the amplifier.

27. The device of claim 21, wherein the device includes a control circuit to generate timing signals to the first switch, the second switch, and a set of additional switches to perform sampling operations associated with the amplifier.

28. A method of cancellation or compensation of scaled thermal noise in a conversion phase of a device having a capacitive sampling structure from capture of the scaled thermal noise in an acquisition phase, the method comprising:
closing a first switch coupled to an amplifier input of an amplifier of the device with the amplifier input coupled to an input capacitor structure;
closing a second switch coupled to an output capacitor structure with the output capacitor structure between the second switch and an output of the amplifier;
opening the first switch after the first switch has been closed for a first time interval; and
opening the second switch after the second switch has been closed for the first time interval, with the first and second switches operated with synchronous correlated actuation of closing and opening.

29. The method of claim 28, wherein the method includes varying a sampling bandwidth in the acquisition phase by controlling a third switch in a closed position for a portion of time that the first switch is in a closed position.

30. The method of claim 28, wherein the method includes controlling generation of timing signals to the first switch, the second switch, and a set of additional switches to perform sampling operations associated with the amplifier in a first stage of an analog-to-digital converter with a differential arrangement of the input capacitor structure with a second input capacitor structure and with the amplifier in communication with a second stage of the analog-to-digital converter.

* * * * *

UNITED STATES PATENT AND TRADEMARK OFFICE
CERTIFICATE OF CORRECTION

PATENT NO. : 11,063,602 B1
APPLICATION NO. : 16/782623
DATED : July 13, 2021
INVENTOR(S) : Bodnar et al.

It is certified that error appears in the above-identified patent and that said Letters Patent is hereby corrected as shown below:

On the Title Page

In item (22), in "Filed", in Column 1, Line 1, after "2020", insert --linebreak
(65) Prior Publication Data
US 2021/0242875 A1 Aug. 5, 2021--

In the Claims

In Column 17, Line 51, in Claim 25, after "includes", insert --:--

In Column 17, Line 52, in Claim 25, before "a", insert --linebreak--

In Column 18, Line 15, in Claim 26, after "includes", insert --:--

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*